United States Patent
Dalton et al.

(10) Patent No.: US 7,512,202 B2
(45) Date of Patent: Mar. 31, 2009

(54) HARMONIC DETECTOR SYSTEM AND METHOD

(75) Inventors: Declan M. Dalton, Dooradoyle (IE); Lawrence M. DeVito, Tewksbury, MA (US); Mark Ferriss, Rochestown (IE); Paul J. Murray, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 594 days.

(21) Appl. No.: 10/832,187

(22) Filed: Apr. 26, 2004

(65) Prior Publication Data
US 2005/0027763 A1    Feb. 3, 2005

Related U.S. Application Data

(60) Provisional application No. 60/490,649, filed on Jul. 28, 2003.

(51) Int. Cl.
*H04L 7/00*    (2006.01)

(52) U.S. Cl. .............. 375/368; 375/326; 375/327; 375/373; 375/375

(58) Field of Classification Search .............. 375/368, 375/326, 327, 373, 375
See application file for complete search history.

(56) References Cited

U.S. PATENT DOCUMENTS

| | | | | | |
|---|---|---|---|---|---|
| 4,617,679 | A | * | 10/1986 | Brooks | 375/374 |
| 4,641,323 | A | * | 2/1987 | Tsang | 375/324 |
| 5,192,916 | A | * | 3/1993 | Glass | 327/157 |
| 5,297,185 | A | * | 3/1994 | Best et al. | 375/368 |

* cited by examiner

*Primary Examiner*—Ted Wang
(74) *Attorney, Agent, or Firm*—Iandiorio Teska & Coleman

(57) ABSTRACT

A harmonic detector including a pattern detector circuit responsive to a clock signal and a data signal configured to detect a target bit pattern from said data signal, and a time-out circuit responsive to said pattern detector circuit configured to detect the absence of said target bit pattern during a predetermined time-out parameter for indicating when said clock signal exceeds said data signal by a factor of two or more.

15 Claims, 5 Drawing Sheets

HARMONIC DETECTOR SYSTEM AND METHOD

RELATED APPLICATIONS

This application claims the benefit of U.S. Provisional Application No. 60/490,649 filed Jul. 28, 2003, incorporated by reference herein.

FIELD OF THE INVENTION

This invention relates to an improved harmonic detector system and method which can detect false locking of a clock signal to a data signal.

BACKGROUND OF THE INVENTION

A fiber optic communications link typically includes a transmitter which transmits and directs light emitted from a laser diode through a fiber optic cable. At the receiving end of the fiber optic cable the light is detected by a photo detector and converted into an electrical current. The current is converted to voltage by a transimpedance amplifier and then amplified by a limiting amplifier. The amplified voltage signal is applied to a clock and data recovery (CDR) circuit which extracts a clock signal from the received data and acquires the frequency of the incoming data by comparing the frequency of the clock signal to the frequency of the incoming data. The clock and data recovery circuit also acquires and tracks the phase of the incoming data, which is known as phase acquisition.

The frequency acquisition is typically acquired with a frequency lock loop (FLL) circuit and the phase acquisition is acquired with a phase lock loop (PLL) circuit. The FLL circuit typically includes a frequency detector, a charge pump, a loop filter, a voltage controlled oscillator (VCO) and a digital divider. The PLL circuit typically includes the same components as the FLL, but utilizes a phase detector instead of a frequency detector.

Frequency acquisition is achieved by the FLL when the frequency of the recovered clock signal is equal to the frequency of the incoming data (e.g., $f_{CLK}=f_{DATA}$). One distinct drawback of a typical CDR circuit is that the FLL may falsely lock the clock signal to a higher harmonic (integer multiple) of the incoming data signal. In this case, the frequency of the clock signal is greater than the frequency of the data signal by an integer multiple of at least two (e.g., $f_{CLK}=K \times f_{DATA}$, where K=2, 3, 4 ... ). Hence, conventional CDR circuits may falsely lock the clock signal to a higher harmonic of the data signal.

SUMMARY OF THE INVENTION

It is therefore an object of this invention to provide a harmonic detector system and method which can detect false locking of a clock signal to a higher harmonic of a data signal.

It is therefore an object of this invention to provide a harmonic detector system and method which can detect false locking of a clock frequency at a frequency which is greater than or equal to twice the frequency of a data signal.

This invention results from the realization that a truly innovative harmonic detector system and method which can detect false locking of a clock signal to a higher harmonic of the data signal or to any frequency which is greater than or equal to twice the frequency of the data can be achieved with a pattern detector circuit which detects target bit patterns in the data signal which are indicative that false lock has not occurred and a time-out circuit responsive to the pattern detector circuit which detects the absence of such target bit patterns for a predetermined time-out parameter thereby indicating a false lock to harmonic has occurred.

This invention features a harmonic detector including a pattern detector circuit responsive to a clock signal and a data signal configured to detect a target bit pattern or patterns from the data signal. A time-out circuit is responsive to the pattern detector circuit and is configured to detect the absence of the target bit pattern or patterns during a predetermined time-out parameter for indicating when the clock signal exceeds the data signal by a factor of two or more.

In one embodiment, the time-out parameter may be a predetermined number of transitions of the data signal. The transitions may be the rising edge of the data signal. The time-out parameter may be a predetermined amount of time. The predetermined amount of time may be any number of cycles of the clock signal. The time-out circuit may include a 13-bit binary counter configured to count the transitions of the data signal. The pattern detector may detect any one or any combination of the target bit patterns chosen from the group consisting of 010, 101, 0101, 1010, 010101, and 101010. The pattern detector may detect a target bit pattern having a pattern of alternating ones and zeros. The pattern detector may include an indicator circuit for detecting the target patterns. The indicator circuit may include a plurality of AND gates. The indicator circuit may include an OR gate. The pattern detector may include a plurality of storage devices configured to store the previous values of the data signal. The pattern detector circuit may reset the time-out circuit when the target bit pattern is detected.

This invention further features a method of detecting a false lock of a clock signal to a data signal, the method including detecting a target bit pattern or patterns from the data signal, and detecting the absence of the target bit pattern or patterns for a predetermined time out parameter which indicates the clock signal exceeds the data signal by a factor of two or more.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
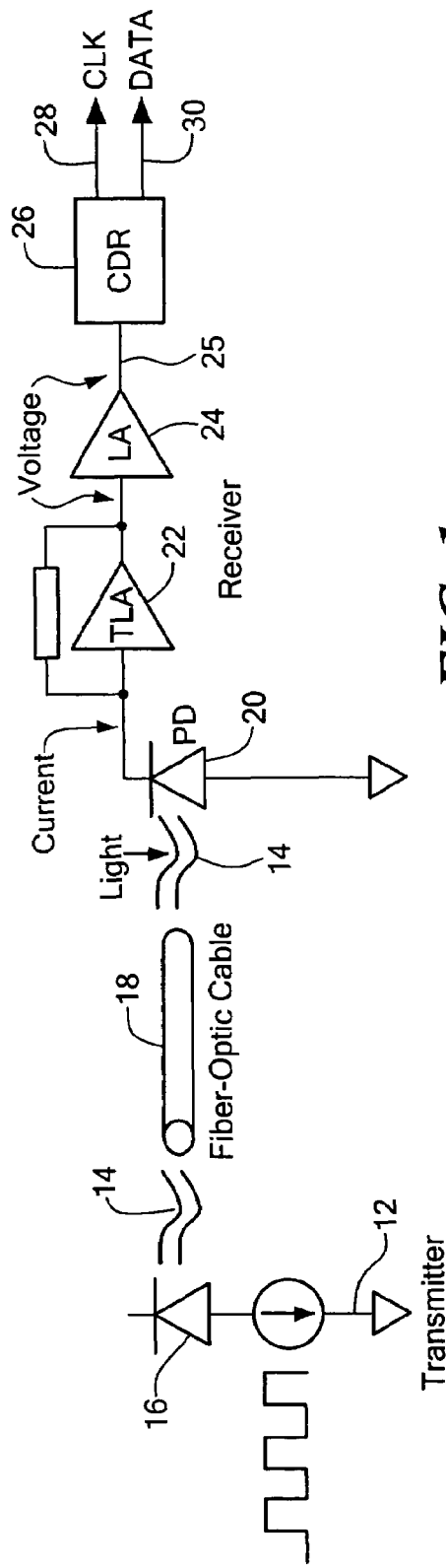
FIG. 1 is a schematic block diagram of a typical fiber optic communications link.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

As discussed in the Background section above, fiber optic communications link 10, FIG. 1 typically includes transmitter 12 to transmit and direct light 14 emitted from laser diode 16 through fiber optic cable 18. At the receiving end of fiber optic cable 18 light 14 is detected by photodetector 20 which converts light 14 into an electrical current. The current is converted to a voltage by transimpedance amplifier 22 and then limited by limiting amplifier 24. The limited and amplified signal on line 25 is then applied to clock and data recovery circuit 26 which extracts a clock signal on line 28 and a data signal on line 30.

Figure 2:
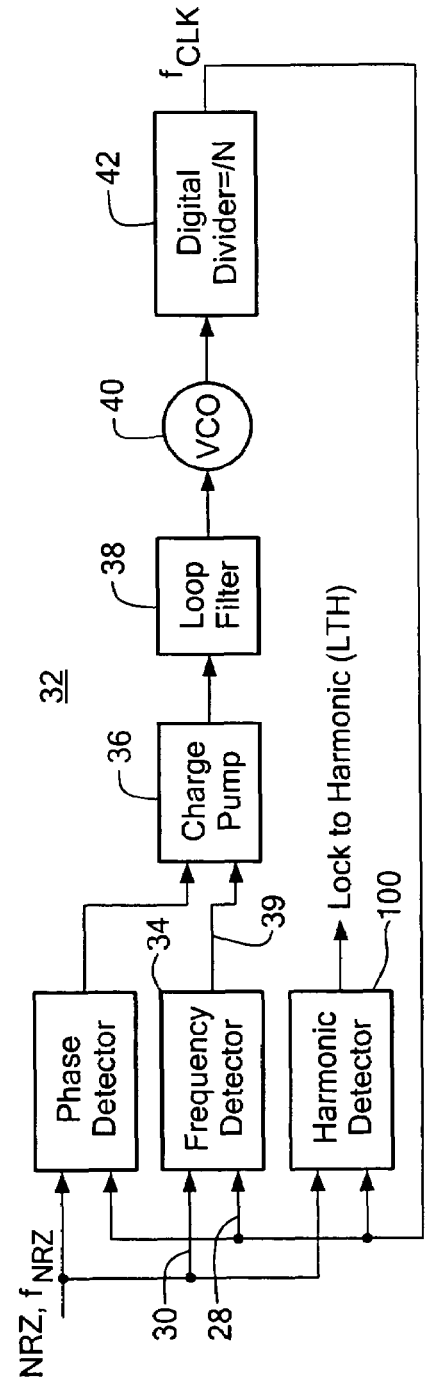
FIG. 2 is a schematic block diagram showing the clock and data recovery circuit of FIG. 1 employing the harmonic detector of this invention.

Frequency lock or acquisition is typically achieved with a frequency lock loop (FLL) circuit, such as FLL circuit 32, FIG. 2. FLL circuit 32 may include frequency detector 34 which is responsive to incoming data on line 30 and a recovered clock signal on line 28. FLL loop circuit 32 also includes charge pump 36, loop filter 38, voltage controlled oscillator 40, and digital divider 42.

Figure 3:
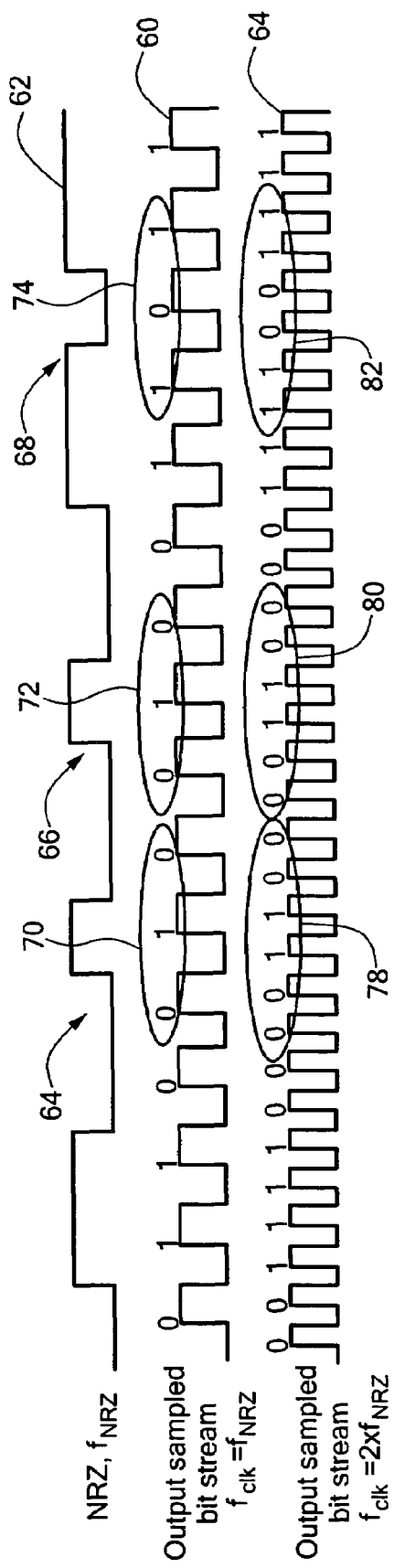
FIG. 3 is a timing diagram showing a typical input data signal to the clock and data recovery circuit shown in FIG. 2, an example of the clock signal correctly locked to the data signal, and an example when the clock signal is falsely locked to a higher harmonic of the data signal.

FLL loop circuit 32 of the clock and data recovery circuit may sometimes falsely lock the clock signal on line 28 to a higher harmonic of the data signal on line 30. For example, as shown in FIG. 3, when the frequency of clock signal 60 is equal to the frequency of data signal 62 a correct frequency lock is achieved. However, in this example, when the frequency of clock signal 60 is twice the frequency of data signal 62, e.g., higher harmonic, as shown by clock signal 64, FLL circuit 32 may lock to the higher harmonic which leads to a false lock condition.

As known to those skilled in the art, there is a very high probability that a certain number of target bit patterns, such as target bit pattern 010, indicated at 64 and 66, and target bit pattern 101, indicated at 68 will be present in data signal 62. When the frequency of clock signal 60 is equal to the frequency of data signal 62, these target patterns are correctly sampled as 010, as indicated at 70 and 72 and as 101, as indicated at 74. However, when the frequency of clock signal 60 is twice the frequency of data signal 62, as shown by clock signal 64, the target bit patterns 010 are sampled as 001100, as indicated at 78 and 80, and the target bit pattern 101 is sampled as 110011, as indicated at 82.

Figure 4:
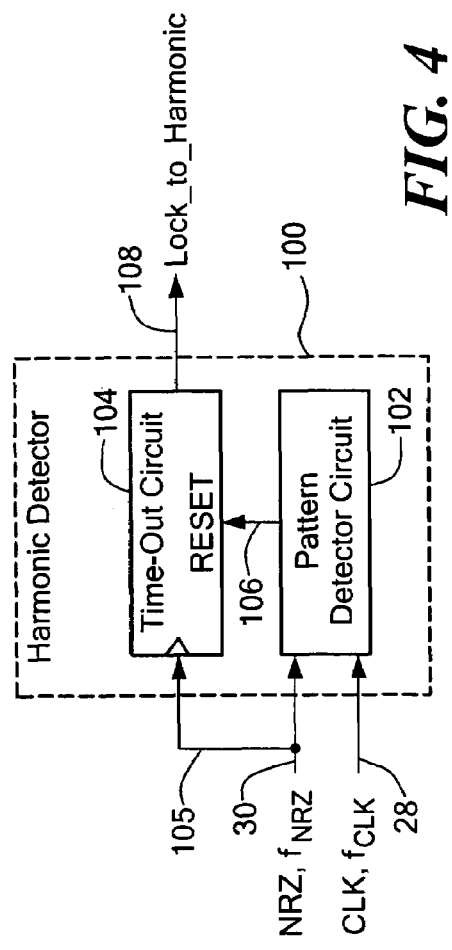
FIG. 4 is a schematic block diagram showing the components of a preferred embodiment of the harmonic detector of this invention.

Harmonic detector 100, FIG. 4, of this invention includes pattern detector circuit 102 which is responsive to a clock signal on line 28 and a data signal on line 30 (also shown in FIG. 2) and is configured to detect target bit patterns, such as 010, 101, 1010, or any similar target bit patterns with alternating ones and zeros as known to those skilled in the art, from the data signal on line 30. Harmonic detector 100 also includes time-out circuit 104 which is responsive to pattern detector circuit 102 on line 106 and the data signal on line 105. Time out circuit 104 is designed to detect the absence of target bit patterns (e.g., 101, 010, 0101) for a predetermined time-out parameter (discussed in detail below). If time-out circuit 104 does not detect any target bit patterns within the predetermined time-out parameter, time-out circuit 104 indicates a false lock of the clock signal on line 28 to a frequency greater than or equal to twice the frequency of the data signal on line 30. As described above, when the frequency of the clock signal on line 28 is greater than or equal to twice the frequency of the data signal on line 30, target bit patterns in the form of 010 will be sampled as 001100, target patterns such as 101 will be sampled as 110011, and the like. Hence, if time-out circuit 104 does not detect any target bit patterns for a predetermined time-out parameter, such as a predetermined number of transitions of the data signal, e.g., 1024 rising or falling transitions of the data signal, or any number of transitions of the data signal which may occur to those skilled in the art, or a predetermined amount of time, e.g., 1024 cycles of the clock signal or any number of clock cycles or amount of time known to those skilled in the art, then the clock signal on line 28 is falsely locked to a frequency which is greater than or equal to twice the frequency of the data signal on line 30 and a lock to harmonic signal is generated on line 108. As discussed in further detail below, when target bit patterns are detected by pattern detector circuit 102, a reset signal on line 106 resets time-out circuit 104 which indicates the clock signal on line 28 is correctly locked to the data signal on line 30 because the predetermined time-out parameter is never reached. In one design, a 13 bit binary counter may be used to count transitions of the data signal, although this is not a necessary limitation of this invention, as any type of time-out monitoring device may be used by those skilled in the art.

Figure 5:
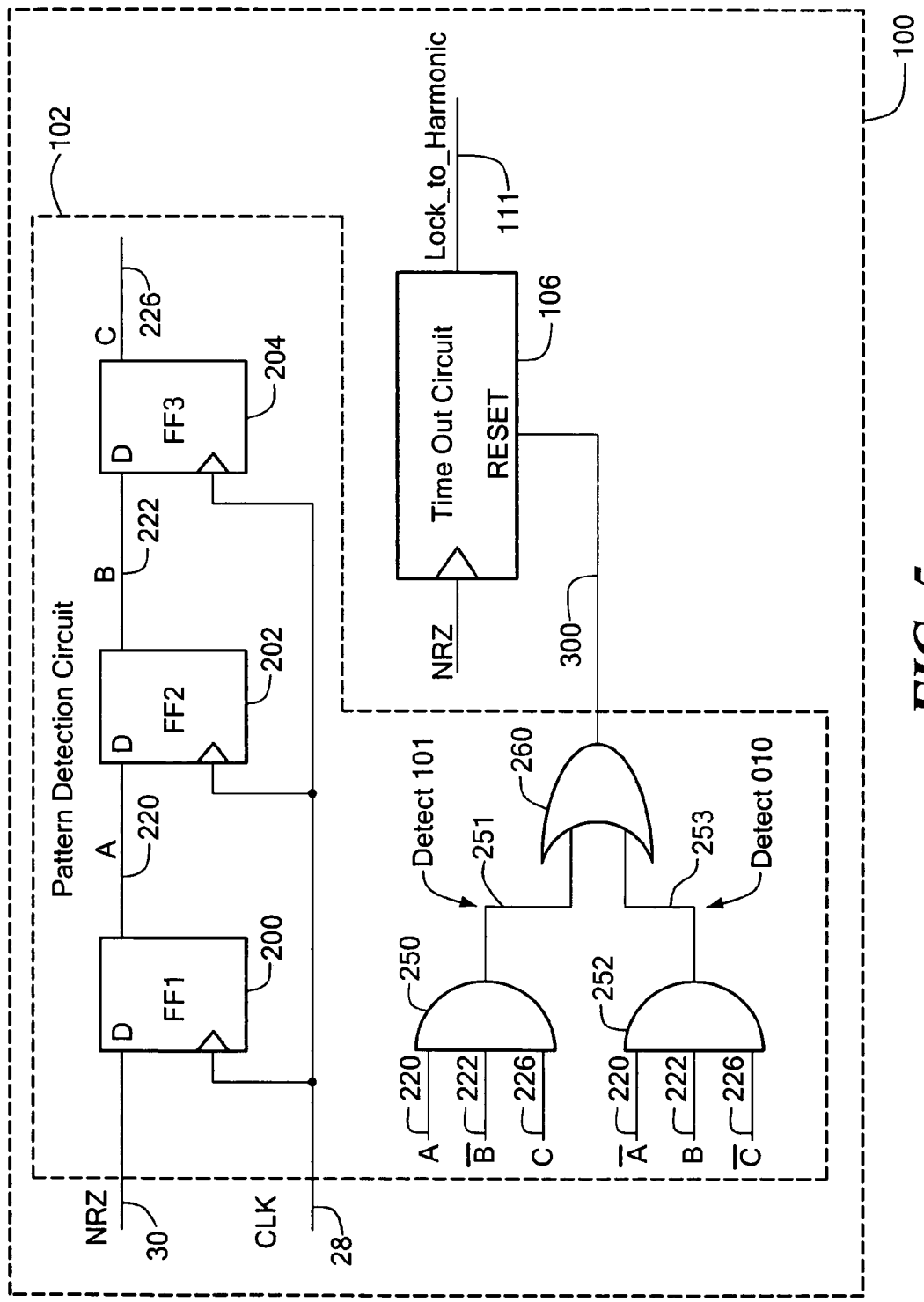
FIG. 5 is a schematic block diagram showing in further detail the various components of the pattern detection circuit shown in FIG. 4.

Pattern detector circuit 102, FIG. 5 may include a plurality of storage devices, such as storage device 200, storage device 202, and storage device 204 (e.g., D-type flip-flops) which are configured to store the previous values of the data signal on line 30, such as the previous, twice previous and thrice previous values of the data signal on line 30 clocked by transitions of the clock signal on line 28. The stored values in storage devices 200-204 are used to provide a history of the transitions of the data signal on line 30 and are for the detection of target bit patterns in the data signal, as described below.

In operation, the data signal on line 30 is applied to the input of storage device 200 (e.g., FF1). On the next rising edge of clock signal 266, FIG. 6, e.g., transition 208, the logic level of the data signal on line 30, FIG. 5, is clocked into storage device 200 (e.g., FF1) and appears as A on line 220, indicated by arrow 217, FIG. 6. On the next rising edge of clock signal 266, e.g., rising edge 230, the logic level A on line 220 is clocked into storage device 202 (e.g., FF2) and appears as B on line 222, as indicated by arrow 224, FIG. 6. Finally, on rising edge 232 of clock signal 266, the logic level B on line 222, FIG. 5 is clocked into storage device 204 (e.g., FF3) and appears as C on line 226, as indicated by arrow 228, FIG. 6. Hence, plurality of storage devices 200, 202, and 204 provide a history of the values of the data signal on line 30.

Detection device 250, e.g., an AND gate, is responsive to the occurrence of the A signal on line 220, the $\overline{B}$ signal on line 222 (the inverse of B), and the C signal on line 226 to pass logic high signal on line 251 to detection device 260 (e.g., an OR gate) which sends a logic high on line 300 to reset time-out circuit 106 when a target bit pattern of 101 is detected. Similarly, detection device 252, FIG. 5, e.g., an AND gate, is responsive to the occurrence of the $\overline{A}$ signal (the inverse of A) on line 220, the B signal on line 222, and $\overline{C}$ signal on line 226 (the inverse of C) and to pass a logic high on line 253 to detection device 260 when a target bit pattern of 010 is detected. Detection device 260 passes a logic high on line 300 to reset time-out circuit 106 when a target bit pattern 010 is detected. Therefore, when target bit patterns are detected by pattern detection circuit 102, time-out circuit 106 is reset, the predetermined time-out parameter is never acquired and a false lock of the clock signal to a frequency greater than or equal to twice the data signal or a higher harmonic on line 111 is not generated.

Figure 6:
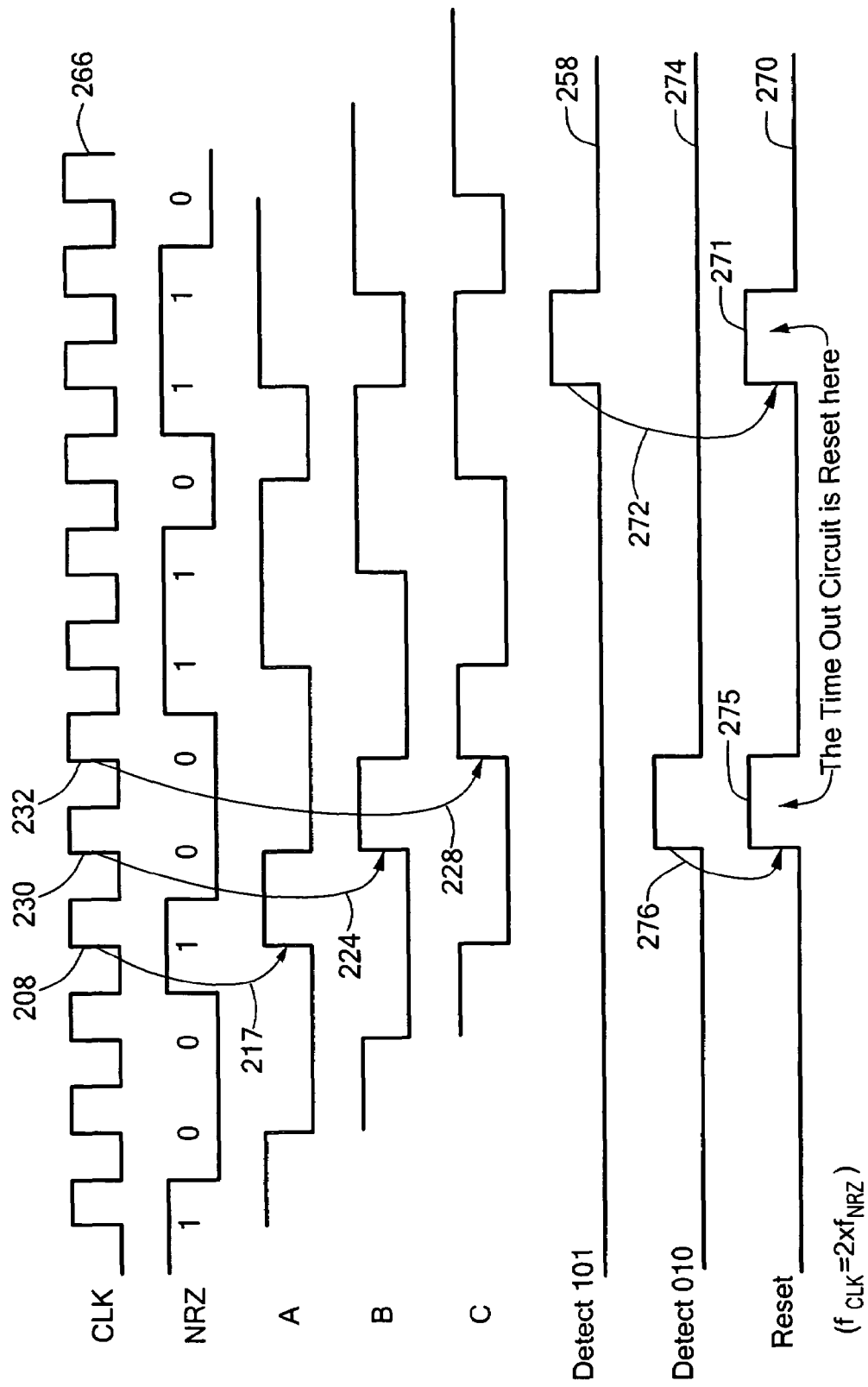
FIG. 6 is a timing diagram of the harmonic detector shown in FIG. 5.

As shown in FIG. 6, detect 101 signal 258 is used to generate pulse 271 of reset signal 270, as indicated by arrow 272 and detect 010 signal 274 is used to generate pulse 275 of reset signal 270, as indicated by arrow 276.

Figure 7:
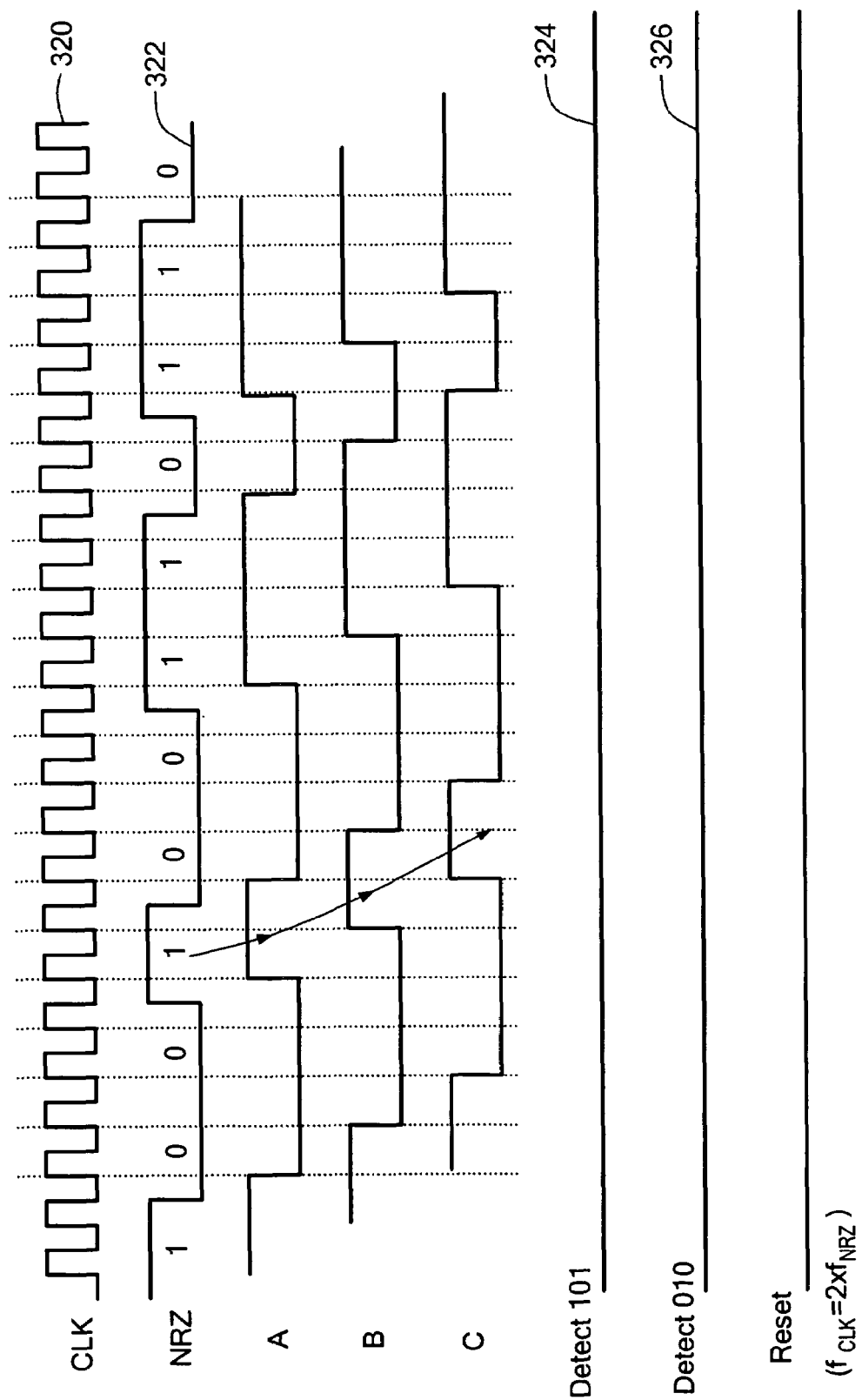
FIG. 7 is a timing diagram for the harmonic detector shown in FIG. 5 detecting a false lock when the frequency of the clock signal is twice the frequency of the data signal.

As shown in FIG. 7, clock signal 320 has a frequency which is twice the frequency of data signal 322. In this example, it can be seen that no target bit patterns have been detected, as shown by detect 101 signal 324 and detect 010 signal 326 never being generated. Hence, time-out circuit 106, FIG. 5 will never be reset and the predetermined time-out parameter will be acquired which enables a false lock to harmonic signal to occur on line 111.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A harmonic detector system comprising:
    a pattern detector circuit responsive to a clock signal and a data signal configured to detect a target bit pattern or patterns from said data signal; and
    a time-out circuit responsive to said pattern detector circuit configured to detect the absence of said target bit pattern or patterns during a predetermined time-out parameter for indicating when said clock signal exceeds said data signal by a factor of two or more.

2. The harmonic detector system of claim 1 in which said time-out parameter is a predetermined number of transitions of said data signal.

3. The harmonic detector system of claim 2 in which said transitions are the rising edge of said data signal.

4. The harmonic detector system of claim 2 in which said time-out circuit includes a binary counter configured to count said transitions of said data signal.

5. The harmonic detector system of claim 1 in which said time-out parameter is a predetermined amount of time.

6. The harmonic detector system of claim 5 in which said predetermined amount of time is any number of cycles of said clock signal.

7. The harmonic detector system of claim 1 in which said pattern detector detects any one or any combination of said target bit patterns chosen from the group consisting of 010, 101, 0101, 1010, 010101, and 101010.

8. The harmonic detector system of claim 1 in which said pattern detector detects a target bit pattern having a pattern of alternating ones and zeros.

9. The harmonic detector system of claim 1 in which said pattern detector includes an indicator circuit for detecting the presence of said target patterns.

10. The harmonic detector system of claim 9 in which said indicator circuit includes a plurality of AND gates.

11. The harmonic detector system of claim 9 in which said indicator circuit includes an OR gate.

12. The harmonic detector system of claim 1 in which said pattern detector includes a plurality of storage devices configured to store the previous values of said data signal.

13. The harmonic detector system of claim 1 in which said pattern detector circuit resets said time-out circuit when said target bit pattern is detected.

14. A method of detecting a false lock of a clock signal to a data signal, the method comprising:
    detecting a target bit pattern or patterns from said data signal by a pattern detector; and
    detecting the absence of said target bit pattern or patterns for a predetermined time out parameter which indicates said clock signal exceeds said data signal by a factor of two or more by a time-out monitor.

15. A harmonic detector system comprising:
    a pattern detector circuit responsive to a clock signal and a data signal configured to detect from said data signal any one or any combination of said target bit patterns chosen from the group consisting of 010, 101, 0101, 1010, 010101, and 101010; and
    a time-out circuit responsive to said pattern detector circuit configured to detect the absence of said target bit pattern or patterns during a predetermined time-out parameter for indicating when said clock signal exceeds said data signal by a factor of two or more.

* * * * *